United States Patent [19]
Jones et al.

[11] Patent Number: 5,980,093
[45] Date of Patent: Nov. 9, 1999

[54] INTEGRATED CIRCUIT LAYOUT ROUTING USING MULTIPROCESSING

[75] Inventors: Edwin Jones, Los Altos Hills; James S. Koford, San Jose, both of Calif.

[73] Assignee: LSI Logic Corporation, Milpitas, Calif.

[21] Appl. No.: 08/760,641

[22] Filed: Dec. 4, 1996

[51] Int. Cl.$^6$ ..................................................... G06F 17/50
[52] U.S. Cl. ............................................ 364/489; 364/488
[58] Field of Search .................................... 364/488, 489, 364/490, 491

[56] References Cited

U.S. PATENT DOCUMENTS

| | | |
|---|---|---|
| 4,306,286 | 12/1981 | Cocke et al. . |
| 4,484,292 | 11/1984 | Hong et al. . |
| 4,495,559 | 1/1985 | Gelatt, Jr. et al. . |
| 4,612,618 | 9/1986 | Pryor et al. . |
| 4,613,941 | 9/1986 | Smith et al. . |
| 4,615,011 | 9/1986 | Linsker . |
| 4,621,339 | 11/1986 | Wagner et al. . |
| 4,656,580 | 4/1987 | Hitchcock, Sr. et al. . |

(List continued on next page.)

OTHER PUBLICATIONS

Mohan, S. and Mazumder, Pinaki, "*Wolverines: Standard Cell Placement on a Network of Workstations,*" IEEE Transactions on Computer–Aided Design of Integrated Circuits and Systems, vol. 12, No. 9, Sep. 1993.

Lenoski, Daniel et al., "*The Stanford Dash Multiprocessor,*" Computer, Mar. 1992.

Koza, John, "*Genetic Programming,*" MIT Press, Cambridge, MA 1993, pp. 94–101 and 173.

Sherwani, Naveed, "*Algorithms for VLSI Physical Design Automation,*" Kluwer Academic Publishers, 1993.

Sechen, Carl and Sangiovanni–Vincentelli, Alberto, *Timber Wolf 3.2: A New Standard Cell Placement and Global Routing Package*, IEEE 23rd Design Automation Conference, 1986, Paper 26.1.

Nowatzyk, A. and Parkin, M., "*The S3.MP Interconnect System & TIC Chip,*" Proceedings of IEEE Computer Society Hot Interconnect Symposium, Stanford University, 1993.

Shahookar et al., "A Genetic Approach to Standard Cell Placement Using Metagenetic Parameter Optimization," IEEE 1990, vol. 9, No. 5, no pp#.

*Primary Examiner*—Kevin J. Teska
*Assistant Examiner*—Leigh Marie Garbowski
*Attorney, Agent, or Firm*—Mitchell, Silberberg & Knupp LLP

[57] ABSTRACT

A multithreaded wavefront routing system for simultaneously planning routes for wiring a semiconductor chip surface. The surface has a plurality of grids located thereon, and routes are planned according to a predetermined netlist. The system steps across the surface from a first location to a second location in a wave-type pattern. The system sequentially steps through the grid arrangement on the chip surface and plans routing one grid at a time using a plurality of threaded processors. The system recognizes pins as it steps through grids and determines a plan for the current grid by evaluating current wire position, target pin location, and any currently planned routes, designating reserved locations wherein the route may be planned subsequent to the current grid, and establishing a wire direction for each wire traversing the current grid. The system plans wiring through grids using multiple threaded processors employing shared memory and a semi-hard coded rule based expert system applying heuristics by planning various routes based on current and potential wire locations.

The system propagates wiring and performs memory bookkeeping functions. The system also has the capability to plan an additional route from one target pin toward a first pin. Meetings between routes are designated and resolved. Reservations may be established when a processor plans a route. Mutex locks may be utilized to avoid multiprocessor conflicts.

51 Claims, 11 Drawing Sheets

U.S. PATENT DOCUMENTS

| | | | |
|---|---|---|---|
| 4,777,606 | 10/1988 | Fournier | 364/491 |
| 4,815,003 | 3/1989 | Putatunda et al. . | |
| 4,850,027 | 7/1989 | Kimmel . | |
| 4,872,125 | 10/1989 | Catlin . | |
| 4,908,772 | 3/1990 | Chi . | |
| 4,918,614 | 4/1990 | Modarres et al. . | |
| 5,051,895 | 9/1991 | Rogers . | |
| 5,136,686 | 8/1992 | Koza . | |
| 5,140,526 | 8/1992 | McDermith et al. . | |
| 5,140,530 | 8/1992 | Guha et al. . | |
| 5,144,563 | 9/1992 | Date et al. . | |
| 5,157,778 | 10/1992 | Bischoff et al. . | |
| 5,159,682 | 10/1992 | Toyonaga et al. . | |
| 5,198,987 | 3/1993 | Shindo et al. | 364/490 |
| 5,200,908 | 4/1993 | Date et al. . | |
| 5,202,840 | 4/1993 | Wong . | |
| 5,208,759 | 5/1993 | Wong . | |
| 5,222,029 | 6/1993 | Hooper et al. . | |
| 5,222,031 | 6/1993 | Kaida . | |
| 5,224,056 | 6/1993 | Chene et al. . | |
| 5,245,550 | 9/1993 | Miki et al. | 364/490 |
| 5,249,259 | 9/1993 | Harvey . | |
| 5,251,147 | 10/1993 | Finnerty . | |
| 5,255,345 | 10/1993 | Shaefer . | |
| 5,267,176 | 11/1993 | Antereich et al. . | |
| 5,297,283 | 3/1994 | Kelly, Jr. et al. | 395/650 |
| 5,361,214 | 11/1994 | Aoki | 364/490 |
| 5,587,923 | 12/1996 | Wang | 364/40 |
| 5,631,842 | 5/1997 | Habra et al. | 364/490 |
| 5,636,129 | 6/1997 | Her | 364/488 |
| 5,742,510 | 4/1998 | Rostoker et al. | 364/486.03 |

INTEGRATED CIRCUIT LAYOUT ROUTING USING MULTIPROCESSING

BACKGROUND OF THE INVENTION

1. Field of the Invention

The present invention relates generally to the art of microelectronic integrated circuits, and more specifically to a microelectronic integrated circuit structure and method for routing wires between cells of the circuit.

2. Description of the Related Art

Microelectronic integrated circuits consist of a large number of electronic components fabricated by layering several different materials on a silicon base or wafer. The design of an integrated circuit transforms a circuit description into a geometric layout known as a layout. A layout consists of planar geometric shapes in several layers.

The layout is evaluated to ensure that it meets all of the design requirements. The result is a set of design files collected in an unambiguous representation known as an intermediate form that describes a layout. The design files are converted into pattern generator files used to produce patterns, known as masks, by an optical or electron beam generator.

During fabrication, these masks are used to pattern a silicon wafer using a sequence of photolithographic steps. The component formation requires highly exacting details about geometric patterns and the separation between them. The process of converting the specifications of an electrical circuit into a layout is known as the physical design. Physical design tends to be a tedious and error-prone process due to the tight tolerance requirements and the minuteness of the individual components.

Currently utilized minimum geometric feature sizes of components used in microelectronic integrated circuit fabrication are on the order of 0.5 microns. It is anticipated that the feature size may be reduced to 0.1 microns within several years, permitting fabrication of as many as 4.5 million transistors or one million logic gates on a 25 millimeter by 25 millimeter chip. This feature size improvement trend is expected to continue, with even smaller feature geometries and more circuit elements available on an integrated circuit. Larger die or chip sizes will permit far greater numbers of circuit elements.

Each microelectronic circuit cell includes a plurality of pins or terminals, each of which is connected to pins or terminals of other cells via an electrical interconnect wire or net. A goal of the optimization process is to determine a cell placement such that all of the required interconnects can be made, and the total wirelength and interconnect congestion are minimized.

As illustrated in FIG. 1, a conventional microelectronic integrated circuit 10 comprises a substrate 12 on which a large number of microelectronic circuits are formed. These circuits include large functional macroblocks such as indicated at 14 which may be central processing units, input-output devices, or the like. A typical integrated circuit further comprises a large number of cells 16 arranged in the areas of the substrate 12 not occupied by macroblocks.

The cells may comprise individual logic gates, or more preferably may each compromise a plurality of logic gates that are interconnected to form functional blocks. A cell library consisting of standardized cells that perform desired logical operations are typically provided and combined with other cells to form an integrated circuit having the desired functionality.

The cells 16 have terminals 18 to provide interconnections to other cells 16 on the substrate 12. Interconnections have typically been made via vertical electrical conductors 20 and horizontal electrical conductors 22 that extend between the terminals 18 of the cells in such a manner as to achieve the interconnections required by the netlist of the integrated circuit 10. Other systems have connected cells via electrical conductors which are not orthogonally oriented, and thus interconnections between the various cells of a net may be multidirectional.

In typical conventional integrated circuit design, the electrical conductors 20 and 22 were formed in vertical and horizontal routing channels in a rectilinear (Manhattan) pattern.

Pins or terminals of prior systems were routed in two steps. First, a global router would plan the general location of wires on the layout. Second, a more detailed routing would be prepared by a channel router. With more routing layers becoming available and process technology improving, as well as increases in the number of and of cells and corresponding decrease in feature size, it becomes highly desirable to increase the portion of the chip area used for active components as opposed to wiring. As chip utilization reaches 100 per cent, the physical routing channels tend to disappear and the artificial importance of channel routing becomes insignificant.

The prior art method of hierarchal layout has proven to be inadequate from a runtime standpoint to significantly improve routing for chips having large and complex layouts.

Programs used to route integrated circuits in the two step process described above have been utilized on a single processor. As chip size and complexity continue to increase, the time required to route a chip on a single processor is becoming too long for an efficient design cycle in spite of ever increasing processing speed and efficiency.

It is therefore an object of the current invention to provide a system able to provide detail routing for an entire integrated circuit chip in a single step, i.e. routing the entire chip at the detail level in a single operation.

It is another object of the current invention to provide a system of routing which avoids the extensive time associated with performing the routing function using a single processor.

SUMMARY OF THE INVENTION

A multithreaded wavefront routing system for simultaneously planning routes for wiring a semiconductor chip surface is disclosed herein. The semiconductor chip surface has a plurality of grids located thereon, and routes are planned by the system according to a predetermined netlist. The system steps across the surface from a first location on the surface to a second location on the surface in a sort of wave pattern, such as traversing from the left side of the chip surface to the right side of the surface, or from one corner to the opposite corner. The system sequentially steps through the grid arrangement on the chip surface and plans the routing one row of grids at a time using a plurality of processors.

The system steps through the various grids, establishing a current grid along the wavefront. The system recognizes pins as it steps through the various grids and determines a plan for the current grid using each processor. In determining a plan for the current grid, the system evaluates current wire position, assesses a target pin location, appraises any currently planned routes, designates reserved locations wherein the route may be planned subsequent to the current grid, and establishes a wire direction for each wire traversing the current grid.

The system plans wiring through the various grids using a semi-hard coded rule based expert system which applies a group of heuristics and plans various routes according to where each wire is located and where wires can potentially be located. The system uses multiple processors arranged in a shared memory multiprocessing arrangement as opposed to using distributed memory.

After each planning step, the system propagates wiring from the current grid to a subsequent grid according to the plan. The system then performs memory bookkeeping functions.

The system also has the capability to plan a route from a target pin toward the first pin. The additional route planning occurs simultaneously with first pin route planning by concurrently planning a route from each pin toward a mutual meeting point at a subsequent point along the wavefront.

When separate processors simultaneously plan routes to a mutual meeting point, the first processor and second processor separately designate meetings. These meetings are resolved subsequent to designation by the processors, and may be resolved either by the first processor, the second processor, or another processor.

Reservations of locations may be established by a processor planning a route from one pin to a subsequent pin. Reservation involves assessing the prospective routing designated, the past routing established, planning a route, and reserving locations along the planned route. If planning establishes a first route and subsequent planning shows a better route is available, the reservation on the former route is lifted and the better route reserved.

Locations may be locked and unlocked using mutual exclusion (mutex) locks, whereby two processors may not make calculations or change variables associated with a location. Typical operation of the locking mechanism is for a processor to attempt to plan in an area, to determine the plan and, if the plan is desired, for the processor to lock that area, to reserve the area and remove the lock. During the time the area is locked, other processors cannot perform computations relating to the area and become "stuck" at the area until the lock is removed.

As disclosed herein, the invention may be used with the traditional rectilinear arrangement or may be employed with any other geometry, including a hexagonal arrangement.

Other objects, features, and advantages of the present invention will become more apparent from a consideration of the following detailed description and from the accompanying drawings.

DETAILED DESCRIPTION OF THE INVENTION

Figure 1A:
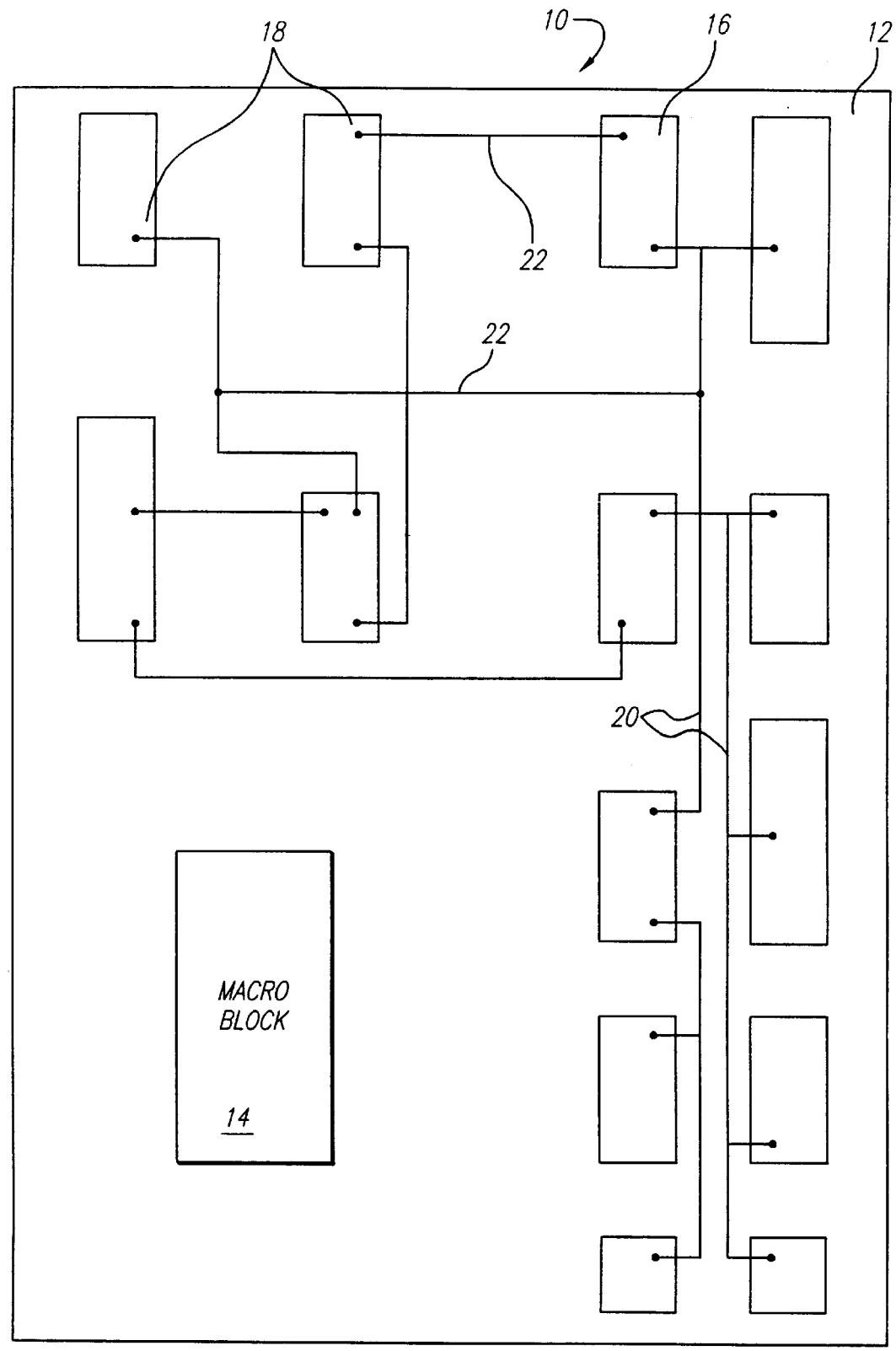
FIG. 1A illustrates a typical semiconductor chip surface arrangement, employing rectilinear routing.
Figure 1B:
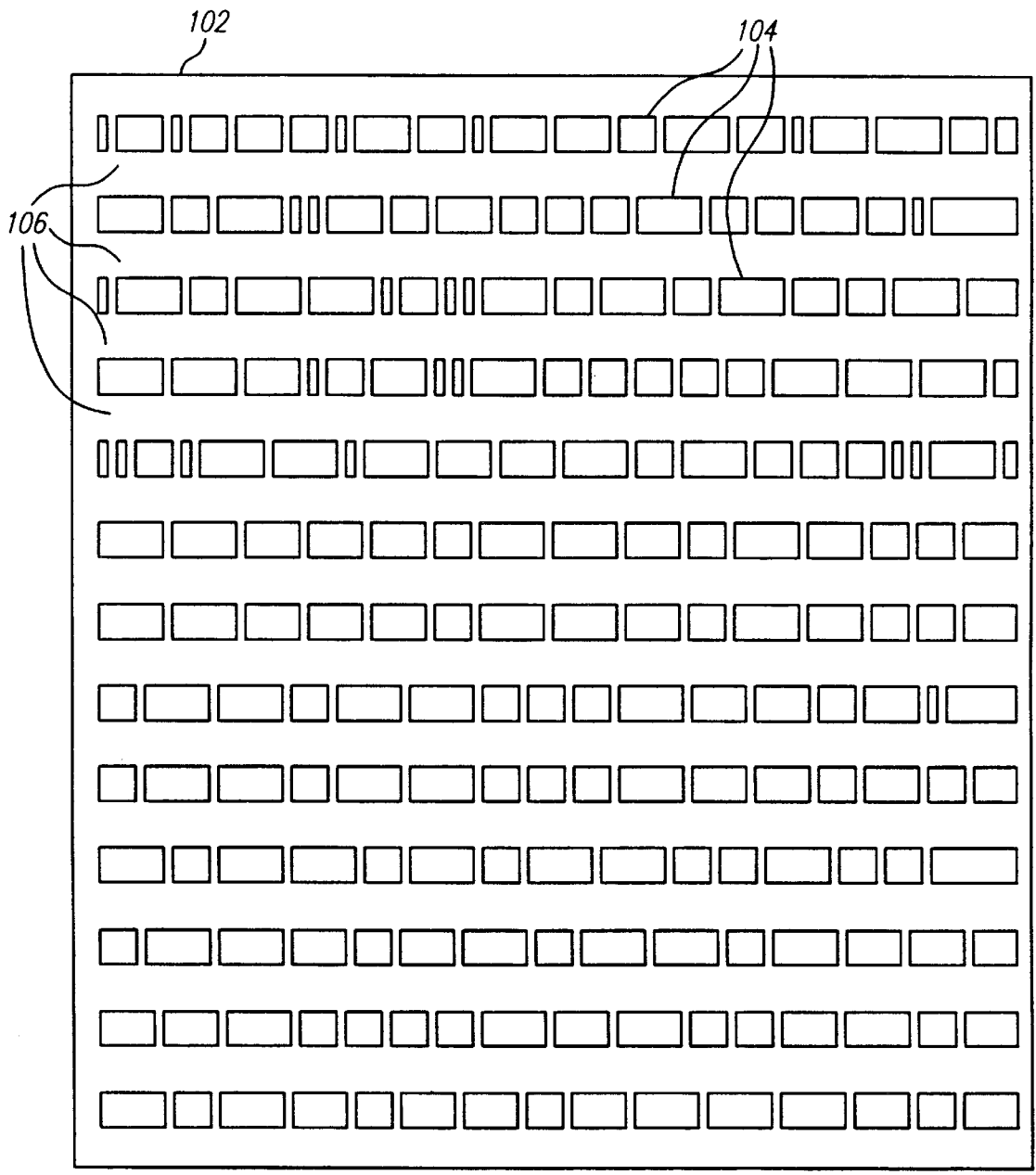
FIG. 1B presents a typical chip design having cells arranged in a rectilinear fashion and prepared for routing.

FIG. 1B illustrates a segment of typical rectilinear chip design as presented for routing. Chip 102 has located thereon a plurality of cells 104 with sets of wiring channels 106 separating the cells 104. Wiring channels 14 are used to route wiring from the pins located on the cells 104 to other pins on the chip 102. While a rectilinear orientation is presented in FIG. 1B, the invention as disclosed herein is not limited to this arrangement. As discussed below, orientations such as a hexagonal geometry arrangement may be routed using the present invention.

Figure 2:
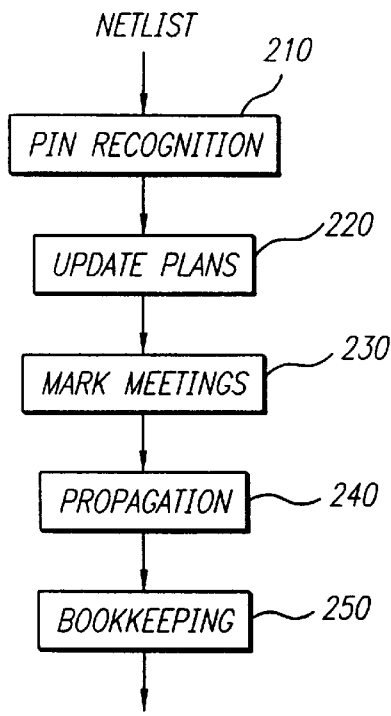
FIG. 2 is a flowchart for a multithreaded wavefront routing system in accordance with the current invention.

FIG. 2 shows the procedure for routing in accordance with the current invention. Initially the semiconductor chip surface abstraction is divided into a plurality of grids, wherein each grid constitutes a single routing track width or one wire space, i.e. the amount of space specified between wires. The grid distance generally represents the distance between wires. The system routes the chip sequentially through lines of grids starting at one edge or corner and proceeding to the opposite edge or corner, commonly called a wavefront of routing. The wavefront proceeds across the chip with unrouted area ahead of the wave and routed area behind. At each grid in the row or wavefront of grids, the routing system makes a decision for routing the local wire through the grid, and the system proceeds sequentially through the grids on completion of the routing for the grid.

As shown in FIG. 2, the first step for the system is recognition of new pins in step 21. The layout for the chip design is complete at the beginning of the process illustrated in FIG. 2, and the layout is presented in a form known as a netlist. The result of the layout is a list of several cells, each containing multiple pins, across the chip surface and an ordering for interconnecting those pins. The locations of pins are fixed, and the desired interconnect arrangement between the pins is known. For each grid, a pin may exist at the grid having a requirement to be connected to a pin or pins at a separate location. The system initially recognizes that an object, i.e. a pin, exists in the current grid and inserts a plan into the process stream associated with the grid position. The insertion of the plan indicates to further processing that a task is pending which must be completed before proceeding to the next grid.

The process develops a plan using current knowledge about the connections between pin pairs and available space for routing in order to make future plans beyond the current grid analyzed. Planning occurs at each grid along the wavefront in order to efficiently route wiring to the target. Planning may result simply in movement in the direction of the current grid, i.e. a simple one grid horizontal movement.

Figure 3:
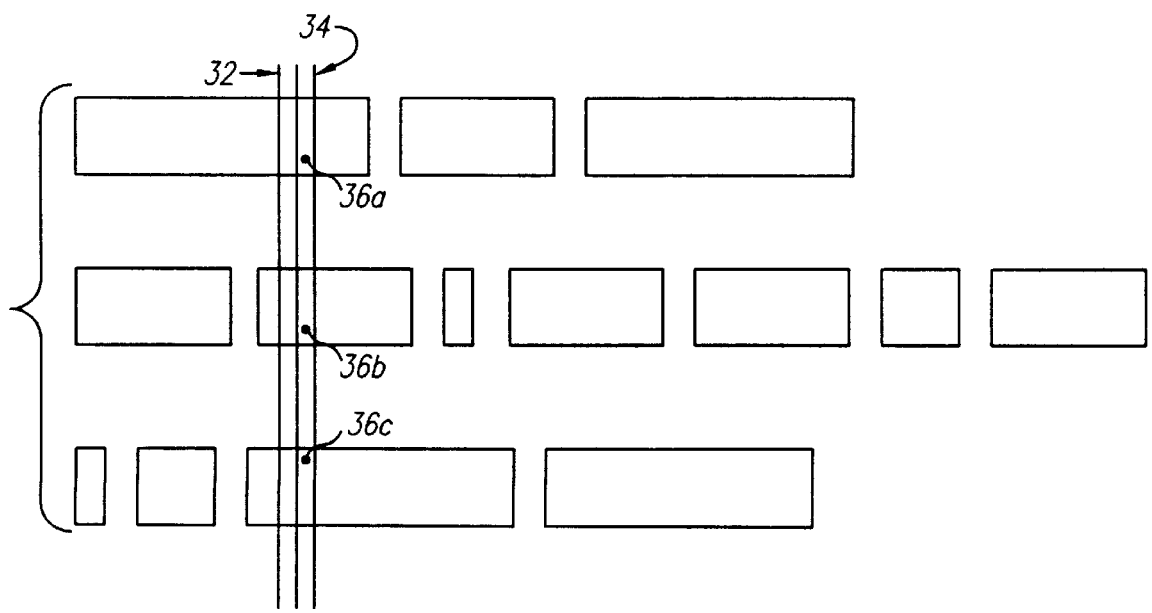
FIG. 3 illustrates operation of the multithreaded wavefront routing system in accordance with the current invention.

A simple example for the rectilinear arrangement is shown in FIG. 3. The case shown in FIG. 3 is for a wavefront propagating from the left edge of the chip to the right edge of the chip. Grid 34 includes cell edges having pins 36a, 36b, and 36c located therein. The system initially completes processing all plans for the previous grid 32 and steps into grid 34. The system checks the grid and recognizes that the three pins 36a, 36b, and 36c are located in the line of grids 34 and thus issues plans to a predetermined memory location denoting that these objects are within the current grid. The plan will be modified and propagated in subsequent steps and cycles. The path of the plan from grid to grid becomes the route for the wire connection from each pin to subsequent pins in a net.

Step 22 updates the routing plans using threaded multiprocessors. Processors may be assigned to route areas on the wavefront in various ways. For example, a processor may be assigned a particular physical sector on the surface; each processor may be assigned grids in a random or partially random manner; or a processor may be assigned grids according to a predetermined prioritization or ordering scheme.

Assigning the processors to sectors may depend on the routing means available. Processors individually assigned to specific sectors may lead to situations where processors assigned to low complexity sectors complete their routing tasks and stand idle while processors assigned high complexity sectors remain in full operation, thereby increasing the time required to route the entire surface. In sector assignment situations, methods may be employed to assist efficient processor assignment to sectors, such as subdividing sectors when a processor becomes idle and assigning the idle processor to a subsector. The predetermined priority arrangement may assign processors to tasks in a particular order, wherein a processor completing a current task returns to the list of assignments and plans the next sequential assignment in order. The optimal method for assigning processors to sectors or grids results in an even distribution of the routing load over all of the processors.

Each thread then processes its assigned plans independently, with the exception of those plans which overlap one another which are controlled using a series of locks and reserved grids, described below. As currently contemplated, the optimal configuration for route planning in accordance with the current invention is between 10 and 30 processors. Using current technology, use of the invention with a system having 16 threaded microprocessors appears to provide the best results for IC chips having tens of thousands of pin connections. It is to be understood that a larger or smaller number of processors may be used with improved results over the prior art. Current personal computers have space for and can support four processors, and many workstations have the capability to operate 32 processors concurrently.

The planning routine located within the system evaluates the current state of the plans and the potential routes available to make connections between pins. The planning routine applies a series of rules to the current state of the plan based on its current direction and the relative location of the desired target. In this process the system examines the available unreserved grids along the proposed path. The proposed locations are ahead of the current grid, forward of the wavefront. The system proposes, based on the current conditions, desired location according to the plan, and location restrictions, that the plan proceed a number of grids in a single direction before the plan must change course or be replanned.

The type of routing employed is based on the wavefront channel router, also known as a greedy router channel, and is described in detail in the paper by Rivest and Fiduccia, "A 'Greedy' Channel Router," 19th Design Automation Conference, Paper 27.2, pp. 418–424 (1981), which is incorporated herein by reference. The Rivest greedy channel router operates based on the theory that optimal channel routing may be obtained if for each grid there is only one horizontal track per net. Split horizontal tracks belonging to the net are joined as much as possible. The Rivest paper applies to rectilinear routing, with clearly defined channels, which is not necessarily always the case in the current invention. However, the theories of Rivest, such as moving forward through a wavefront, are concepts employed in the current invention.

Figure 4:
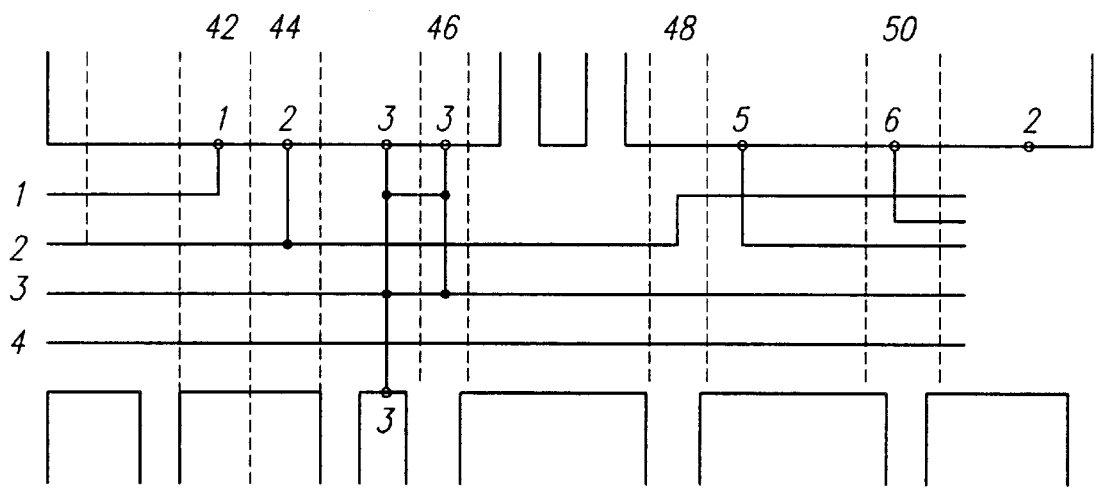
FIG. 4 is a simplified routing arrangement.

According to the Rivest paper, a greedy channel router scans the channel in a left to right manner, completing the wiring in one column before proceeding to the next. A simplified routing arrangement for a four-wire width track is shown in FIG. 4. Initially, in step 42 the system makes necessary connections to any pins at the top and bottom of a column. Only the wiring required to bring the net into the channel is utilized. The nets are brought into the first track which is empty or which contains the desired net. As many tracks are freed as possible by making vertical connections which condense nets occupying more than one track in step 44. This condensing process may complete the task of moving a connection from a pin to a track currently occupied by the pin's net.

The Rivest system attempts in step 46 to minimize the range of tracks occupied by nets located in more than one track. This minimization step tends to diminish the effect of minimizing nets during subsequent steps. The duty to free up tracks using minimization has a relatively high priority.

The Rivest system then makes preference rearrangements in step 46 that move a net up if the next pin in sequence is at the top of the channel, or down if the next pin is at the bottom of the channel. These preference rearrangements have a lower priority than the than the track minimization of step 48. The system chooses longer movements over shorter movements to avoid a "stair-stepping" effect and to maximize the amount of useable vertical wiring available. These movements provide a good means for resolving potential conflicts located in front of the location currently considered without actually using resources to resolve the conflict.

If a pin cannot be connected due to the channel being full, the router adds a new track in step 50, the track being between existing tracks. The Rivest system then connects the unconnected pin to this newly created track.

After stepping through the foregoing steps, the processing for the particular column is complete and the router extends wiring to the next column and repeats the same procedure.

The input for the Rivest greedy router consists of a netlist, initial channel width, minimum movement length, and steady net constant. The greedy router begins with the initial channel width given, and a new track is added whenever channel width is unworkable. The router makes no movements shorter than the minimum movement length.

Rivest's system is a greedy routing down a single channel, which may produce cyclic problems on implementation. The wires coming down the channel may result in a situation where pins are opposite each other relative to pin orientation such that pins going down one channel will yield a geometry where one wire tries to turn into its pin while another wire is trying to reach its pin. This situation is solved when the algorithm attempts to settle the situation before the wires reach the pins, or else one wire must go beyond the pin and backtrack to the pin.

For the current invention, the next step 22 is to determine the actual routing and is the most complex and time consuming step of the cycle. This step is threaded for multiprocessing. The system is a semi-hard coded rule based expert system which applies a group of heuristics and plans various routes according to where a wire is located and where it can go. The current system determines whether wiring can travel from one point to another and if it cannot, whether it can improve itself to a position where it can acquire the target for further planning. The simplest route is to step in the direction of the wavefront toward the target and reconsider the route. Once the system proposes its plan, it submits a reservation to memory for the locations needed for the plan. Thus other processors which make plans for other nets do not use the locations already allocated.

The system then assigns a sector of the grids in the wavefront and the plans associated with those grids to each thread. Each thread then processes its assigned plans independently except for any limitations imposed by reserved grids or locks, which are described below. The planning routine of step 22 applies a series of rules to the current state of the plan based on the current direction and the relative location of the target pin.

The rules for changing direction and planning a route for each individual thread are similar to the rules used in accordance with the Rivest greedy channel router. Split nets are joined as much as possible, and are sometimes brought toward one another by stepping, or "jogging" the nets together, but are joined by working toward one another and toward a meeting point forward of the wavefront. Reserved locations are avoided while planning routes. These rules generally form the basis for planning routes from initial pins to subsequent pins in an efficient manner.

In this process the system examines the available unreserved grids along the proposed path knowing the current state and the proposed target location. The system then proposes that the plan proceed n grids in a certain direction and subsequently either replan or change direction and go m grids in the new direction before replanning. Generally, each layer on the surface represents an individual direction, and thus a change in direction entails a change in layers. This proposed plan constitutes a complete path to the target only under certain circumstances, and the plan must typically be updated several times on subsequent cycles before reaching the target location.

Once a plan is proposed by the system, the locations to be used for the plan are reserved. Each layer of a coordinate is considered a separate grid. If a grid to be utilized by the plan and considered to be available when the plan was developed is discovered to be used by another plan from either the current thread or another thread, the plan is aborted. Reserved grids are released, and the planning phase repeated. Thus if between the time the processor makes plans to cover a particular uncovered grid and subsequent to the planning the grid is reserved by another processor, the first processor must return to the planning stage and replan the proposed route. The probability of another processor reserving a grid between the planning and reservation stages is relatively remote, as the multithreaded wavefront router disclosed herein plans routing for hundreds of grids and the chance of a reservation preempting a plan is minimal.

Figure 5:
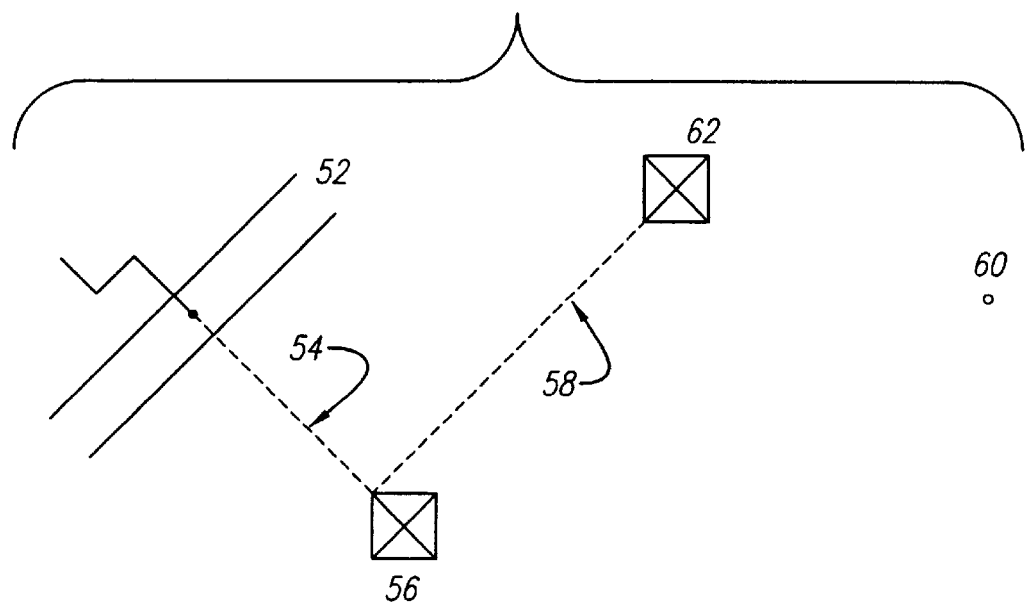
FIG. 5 shows planning of routing paths using a single potential direction change.

As currently implemented, the expert system only bases planning of routing paths using a single potential direction change. As illustrated in FIG. 5, the thread (not shown) plans for the current grid 52 based on known information to continue along current planned path 54. Location 56 indicates the presence of a reserved location, signifying the unavailability of the location for planning purposes, as discussed below. Hence, the planning directs the routing either upward or downward due to the reserved location 54; and upon encountering the reserved location, the system chooses the upward direction based on known conditions including location of the target pin 60 and other reserved locations in potential path. Here the system plans to go upward, and continues along path 58 to location 62, wherein it encounters a second reserved location.

As currently implemented, multithreaded systems only plan to this second reserved location 62, where the plan requires less than two turns, and awaits grid planning to this second reserved location 62 or until reservations are lifted or conditions otherwise dictate replanning and an alternate route are preferable. In maintaining this plan, the current thread would reserve path 54 and 58 and reserve those locations, or all locations in the grids containing those locations.

Use of multiple processing threads raises the potential for particular data locations or variables to be changed by more than one processor at a particular time. In order to maintain the integrity of the process and memory locations and avoid infinite loop situations, the system employs mutual exclusion locks, also known as mutex locks. A processor encountering a variable changeable by other processors must lock the variable, inhibiting the other processor from changing the variable until the lock is removed by the first processor. In this manner, integrity of variables is maintained while multiple processing of sectors occurs. The adverse effects of mutex locks are that a processor may encounter a lock and become "stuck" at a particular point in computation and planning. Locks must therefore be removed as soon as possible.

Figure 6:
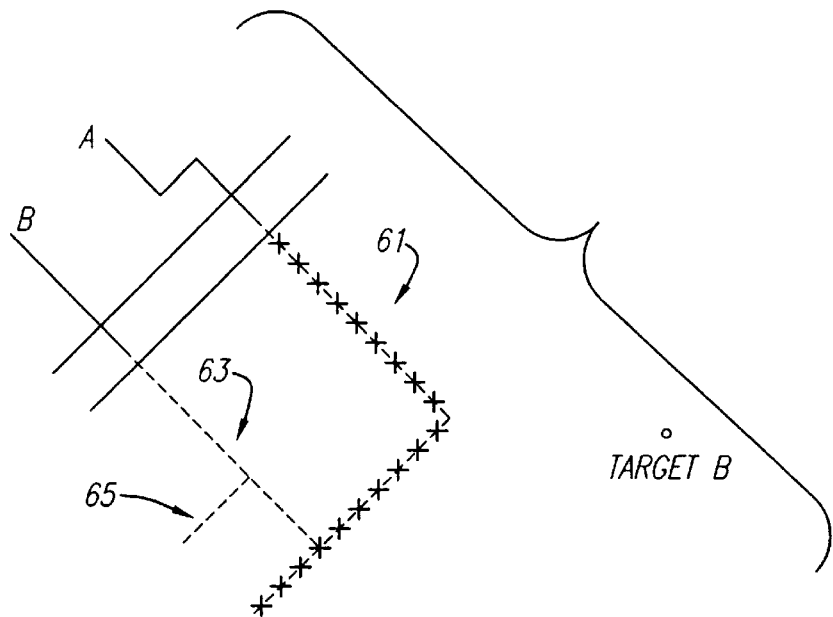
FIG. 6 illustrates the operation of locks and reservations in accordance with the current invention.

In operation, locking prevents a processor from entering or changing a region currently being changed by another processor. To avoid the memory/data conflicts inherent in multiprocessing, access to the aforementioned grids are locked as follows. Each line of grids in the wiring direction for each layer is locked so that only one thread may modify it at a time. As shown in FIG. 6, two lines of grids may be planned using two separate threads. The first thread may consider a series of grids 61 while the second thread is computing possible wire locations. The first thread 61 then locks the series of grids 61. Once the second thread plans to use a series of locations 63 which include grids locked by the first thread, the second processor is prevented from performing changes on grids locked by the first thread. The second thread then will wait until the lock is removed. The second thread should not attempt an alternate plan, as the lock will be removed and the area may become available. In this situation, the first processor decides to reserve the grids as shown, performs the reservation, and removes the lock from the line of grids 61. At this time, the second processor receives an indication that the lock has been removed, but that the line of grids 61 has been removed. Under the preferred mechanization, the thread becomes "unstuck" and proceeds to plan an alternate route, shown as alternate route 65.

If the first thread calculates that a better route is available, or for some other reason series of grids 61 is undesirable for the currently contemplated plan, series of grids 61 is not reserved by the first thread. The lock is removed by the first thread, and the second thread can lock and evaluate series of grids 61 as a potential plan.

Locks are a convention whereby a flag is established for each row of grids on the surface such that the flag is set when the row of grids is locked. Rows of grids are deemed locked or unlocked because providing individual locks for all cell locations would require tens of thousands of locks and extensive overhead. Typical chips will have four thousand rows of grids, a far more manageable quantity.

The plan is reevaluated at each wavefront cycle. However, if a path has been planned during a previous cycle and the succeeding grid has been reserved the existing plan is accepted as is and is used accordingly.

The target of the plan for a pin may either be the other pin of the pin pair or the current location of the plan path coming from the other pin of the pair. Thus it is possible to have two plans controlled by different threads moving across the chip and attempting to meet.

An illustration of the implementation of the system using multiple threads to calculate paths and meeting points between a target location to the initial pin is shown in FIGS. 7A–F. As shown therein, pins 102, 104, 106, and 108 are to be matched to pins 112, 114, 116, and 118, respectively. For purposes of this illustration, it is assumed that there are three threads operating on routing the surface. More threads of course may be used depending on the size of area to be routed and the desired speed of planning.

Figure 7A:
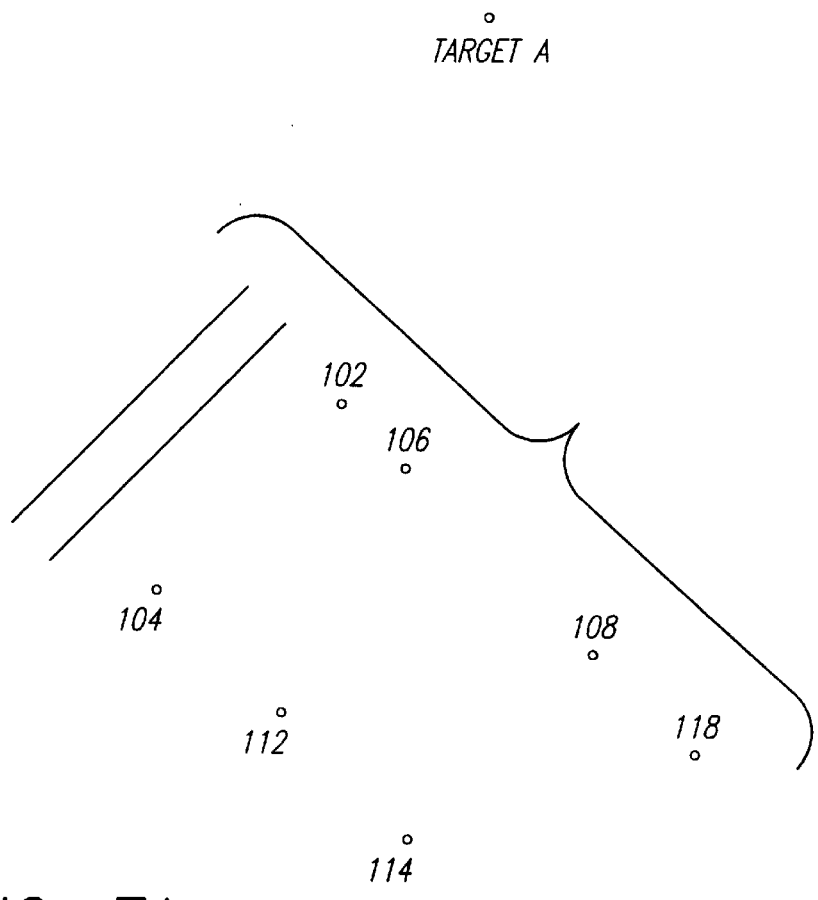
FIGS. 7A through 7F present sequential operation of the multithreaded system, including planning from a second pin in a pin pair toward the first pin in the pin pair.
Figure 7B:
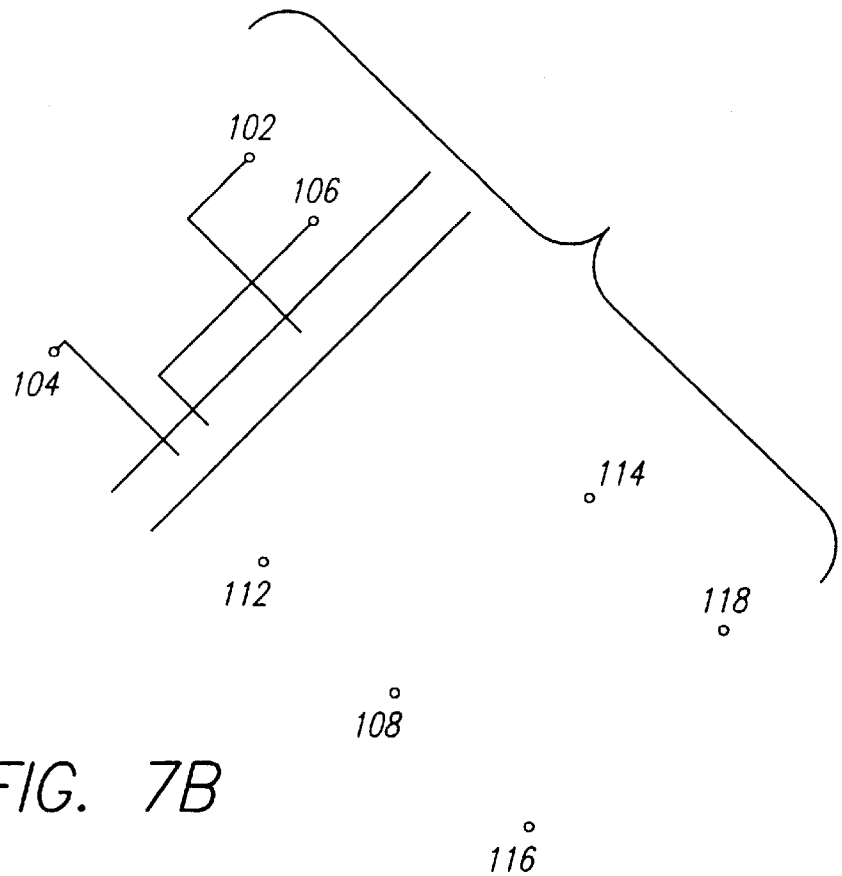
Figure 7C:
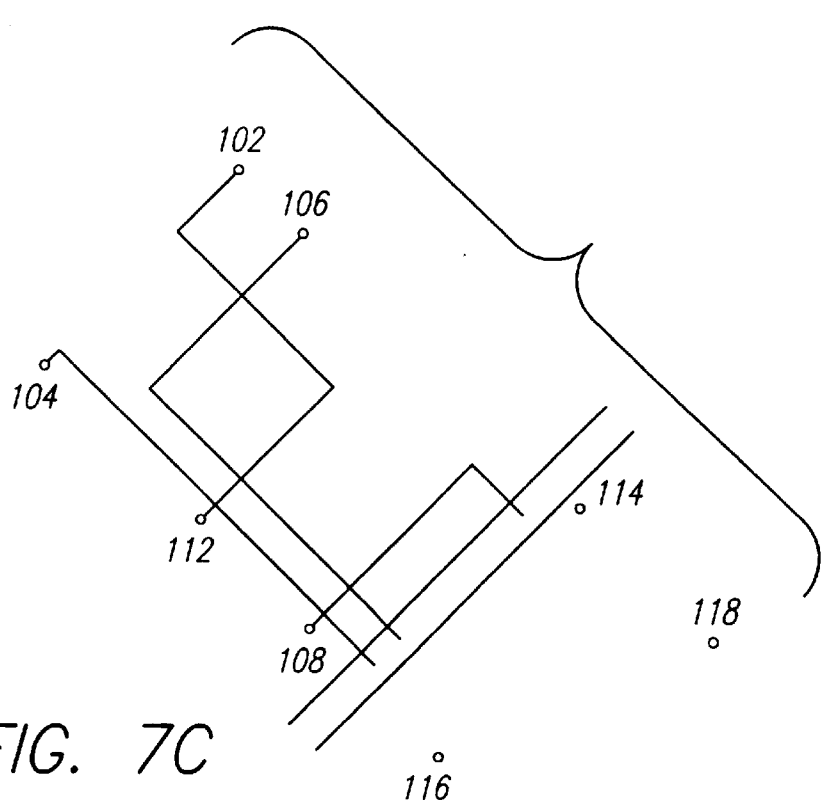

Initially, the first thread plans the connection for the first pin pair 102-112, the second thread plans the connection for the second pin pair 104-114, and the third thread plans the connection between the third pin pair 106-116. The three threads are not shown. In actual operation, a thread handles more than a single pin pair and pins may be associated in groups larger than two, but for purposes of illustration it is assumed that each thread handles a single pin pair at a time. A partial routing, after stepping through wiring for potential planned paths, is shown in FIG. 7B. Potential grids as planned by the second thread are illustrated as reserved grids 120, and other grids cannot plan into reserved grids 120. Pin pair 108-118 have neither been planned nor routed. FIG. 7C illustrates completion of first pin pair 102-112 by the first thread, at which point the first thread begins to plan and route fourth pin pair 108-118.

Figure 7D:
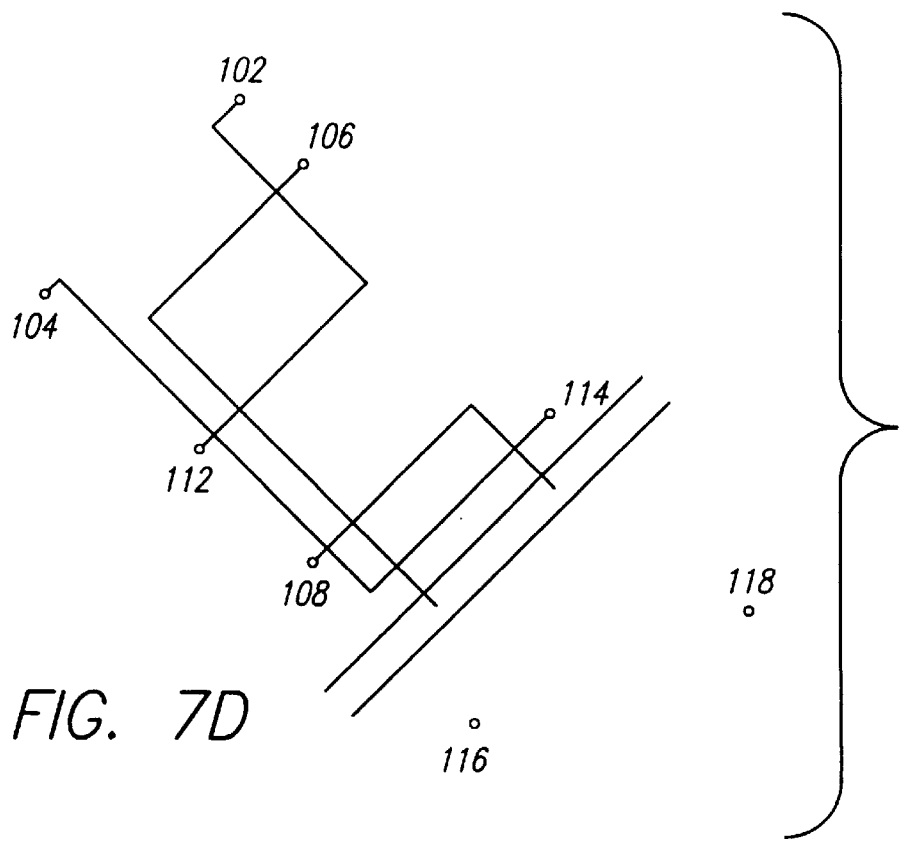

FIG. 7D shows completion of the second pin pair 104-114 by the second thread, which looks to available pin pairs to initiate planning. In the current circumstance, no new pin pair is available, so the thread has no work to accomplish and becomes idle.

Figure 7E:
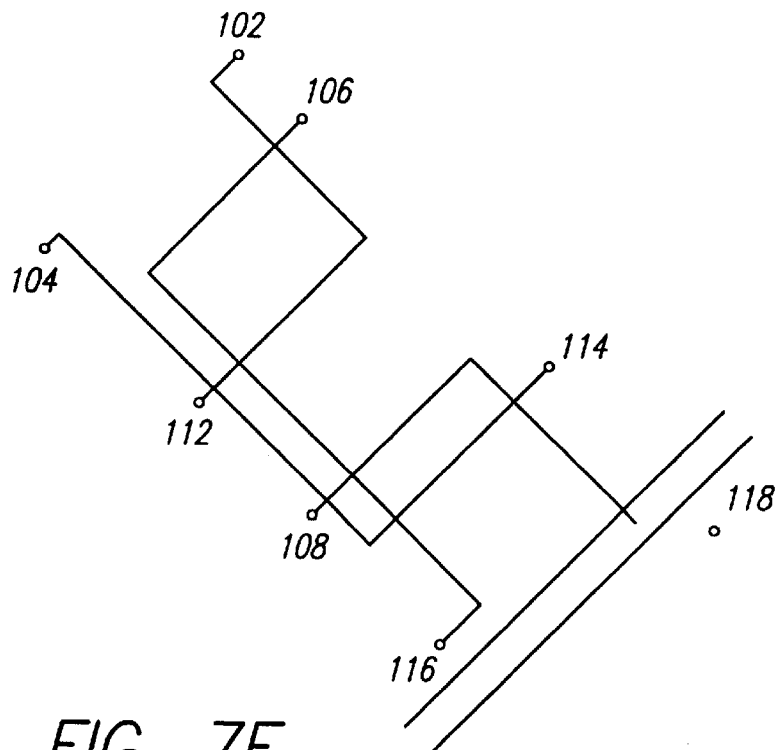
Figure 7F:
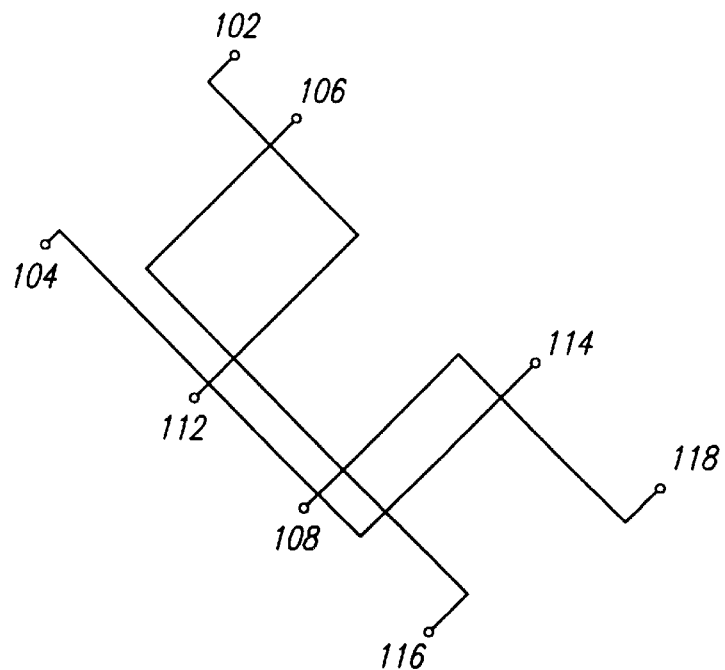

As shown in FIG. 7E, the third thread completes routing the third pin pair 106-116 and no pins remain. Hence third thread ceases operation pending completion of tasks by the other threads. The meeting is resolved by a thread in step 23 as outlined below. The result is full completion of the routing as shown in FIG. 7F. As may be appreciated, use of this multithreaded system is appreciably faster than use of a system employing a single processor.

The simple example outlined above notably does not show the interconnections between multiple pins on a net. Multiple pins are connected in accordance with the principles outlined above, with multiple paths planned from single pins toward the multiple target pins.

The third step in the process, denoted by step 23 in FIG. 2, marks the meetings between two pin locations operated on by different threads. As described above, it is possible to have two plans controlled by independent threads independently generating paths which need to meet and connect. This meeting/connection process could lead to conflicts between threads attempting to access data from the other thread.

This third step requires that under circumstances wherein two threads are forming a plan for a pin pair, upon reaching a location where one processor calculates that it has reached a location where the other processor has planned, the first processor notes the location and begins processing at another location along the wavefront. Both processors accordingly note postulated meetings between plans. The resolution of the meeting between the two routes is accomplished by a single thread after the multiple threads have joined, which may be one of the threads which planned one of the two routes. When the planning thread or threads determine that a meeting has occurred, the thread or threads note the meeting in a list. The list is subsequently processed by a single thread. The single thread processing the meeting list has access to all plan data so that no data conflicts will occur. Generally, the number of meetings per grid step is not significantly large.

Figures 8A, 8B:
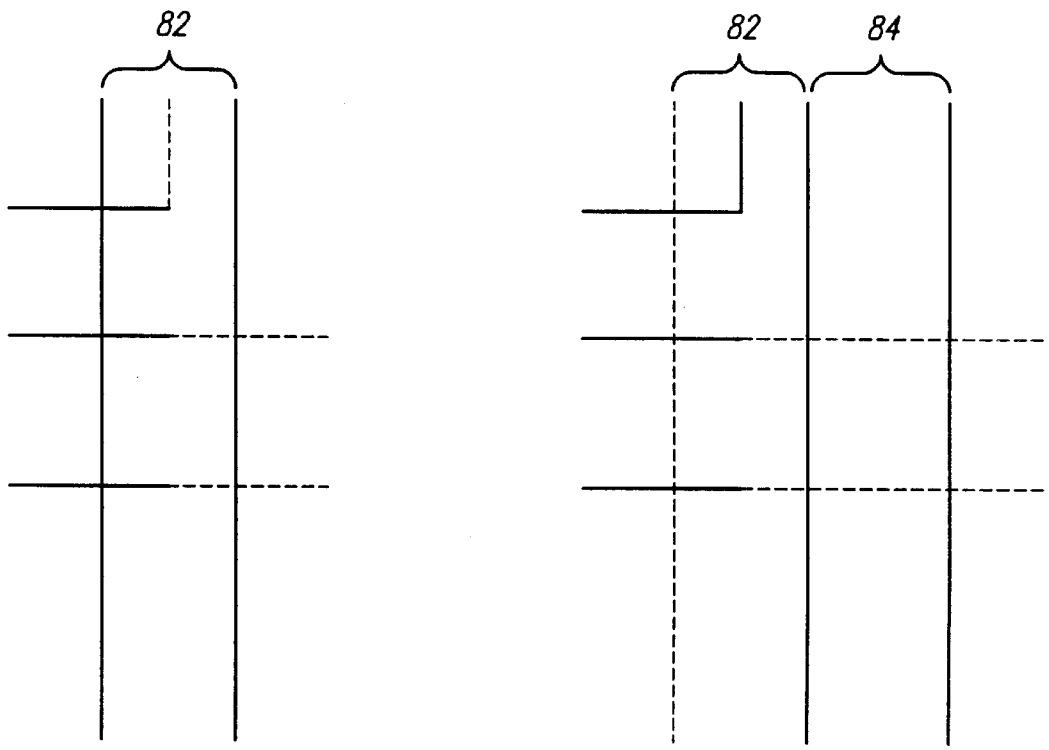
FIGS. 8A and 8B illustrate propagation from one grid to a subsequent grid.

The next step in FIG. 2 is the propagation step 24. After all the plans in the current wavefront have been updated, the new plans are propagated to the proper grid in a new wavefront one line of grids further across the chip. As shown in FIG. 8A, planning for three pin pairs is undertaken, and a desired path through the grid 82 for each pair determined. In FIG. 8B, the threads move to the next line of grids 84 across the chip. This step may be multithreaded, but a single thread may take care of the processing under most circumstances.

The final step in the process of FIG. 2 is step 25, which performs all necessary bookkeeping tasks to step through the current grid and onto the next grid. Most of these bookkeeping operations are concerned with memory management, and update on moving forward one line of grids. Generally, memory has been allocated to resolving the necessary planning steps and on completion of planning for the current grid the memory is freed and reenters the programming queue. The routing of each individual location planned in the grid is stored. Grids are typically reserved for planning purposes, but the system releases those grid reservations over areas which are not required after routing the current grid in the desired direction. Initial conditions for the next grids are established, and prospective plans maintained and utilized in planning routing from the next grid.

While many of the illustrations presented herein illustrate the wavefront propagating from one edge of a figure to the opposite edge, the preferred configuration is to propagate from one corner of the chip to the opposite corner. As shown in the illustrations, the planning and examples are generic in that the connections are made between points in space. Thus the invention operates in accordance with a rectilinear arrangement as well as a hexagonal geometry arrangement as described below, but is not limited to the geometry of the cell array.

The cycle then repeats until the wavefront reaches the opposite corner or opposite edge of the chip.

The processors employed in multithreading use a shared memory multiprocessing arrangement as opposed to distributed memory. All of the processors have access to the shared memory, making for convenient formulation for the problem, and shared memory is readily available. As noted above, and as one of skill in the art will recognize, use of the procedure outlined above in connection with any number of processors greater than one will result in the improved routing contemplated by the invention disclosed herein.

A corner-to-corner wavefront is shown in FIG. 9 in connection with a hexagonal geometric array. This hexagonal geometry is shown in currently pending U.S. patent application Ser. No. 08/XXX,XXX, entitled MICROELECTRONIC INTEGRATED CIRCUIT STRUCTURE AND METHOD USING THREE DIRECTIONAL INTERCONNECT ROUTING BASED ON HEXAGONAL GEOMETRY, assigned to LSI Logic Corporation. As shown in FIG. 9, the intent is to connect pin 91 with pins 92 and 93, and to separately connect pin 94 with pin 95. Two processors are used for this simple example.

Figure 9A:
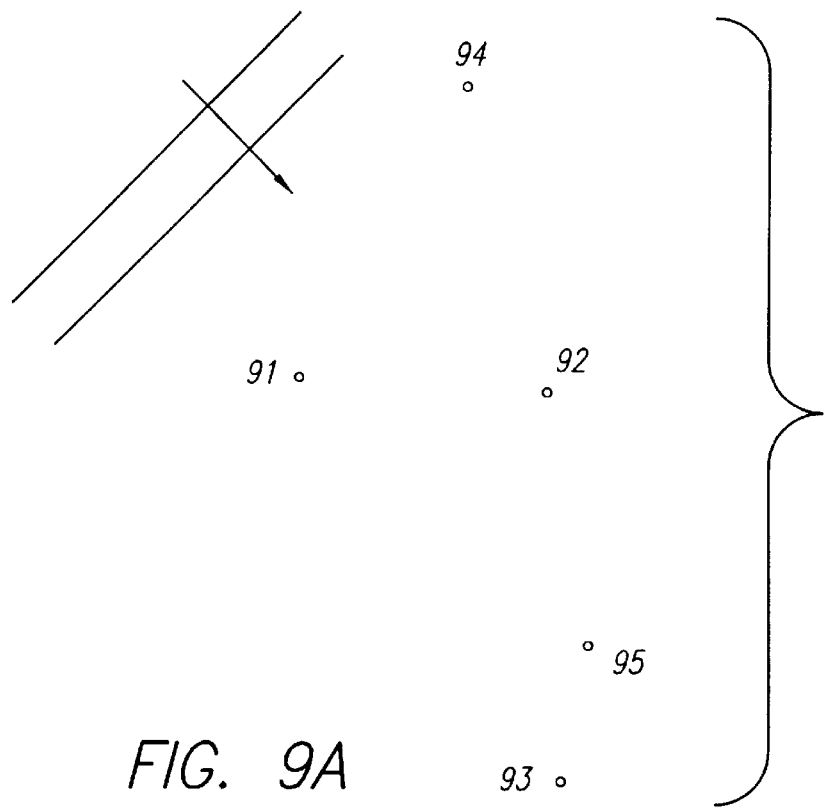
FIGS. 9A through 9E show implementation of the current invention in a hexagonal geometric arrangement.

As shown in FIG. 9A, the wavefront first reaches pin 94, and the first thread (not shown) begins planning the direction for the route to pin 95. The thread determines that the path designated 96 is the most desirable path toward pin 95 based on the current reservations and conditions. As with the previously defined orthogonal case, the system proposes that the plan proceed n grids in a first direction and then m grids in a second direction, planning two directions of grids and reserving those grids accordingly.

Figure 9B:
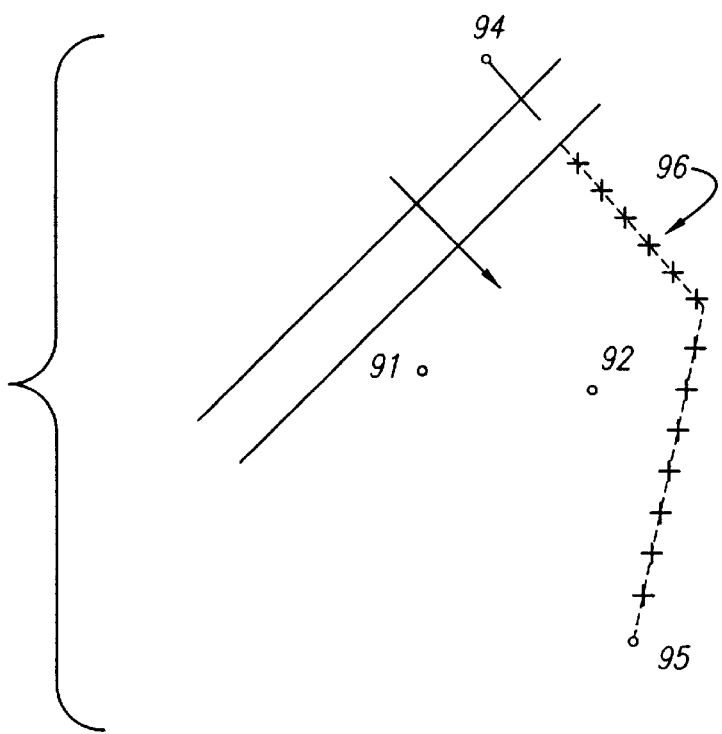

On reaching the next grid, the system encounters pin 91, which must be planned to both pins 92 and 93. The second thread is tasked to plan this route. As shown in FIG. 9B, the second thread plans in a first direction and subsequently encounters the reservation made by the first thread. Consequently, the second thread plans an alternate path which utilizes a portion of the originally desired path and a new path, designated as 97 in FIG. 9B. As shown, the system plans a first path 99 from the first pin 91 to the second target pin 92 as well as a second path 99 from the first pin 91 to the third target pin 93. These paths are designed to overlap as much as possible. The paths are reserved, and again two linear sets of reservations are made per path.

Figure 9C:
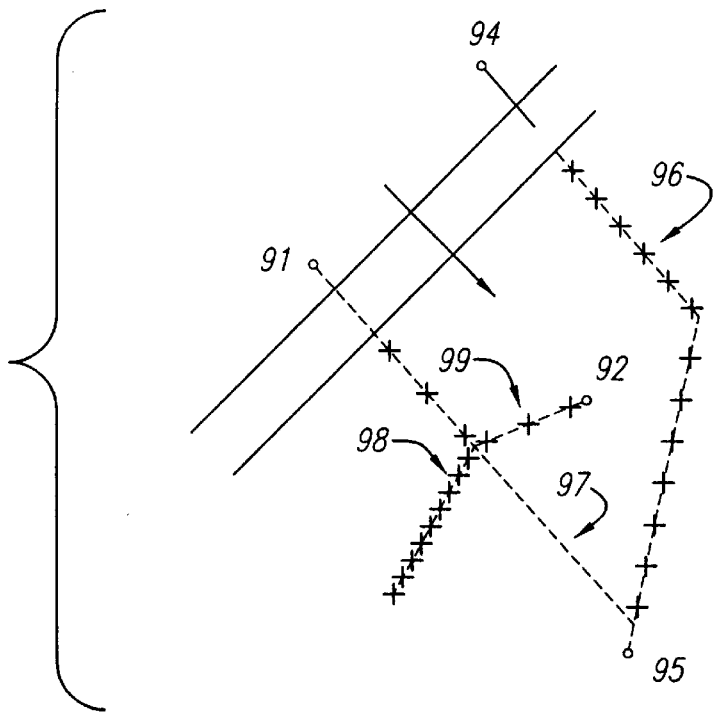
Figure 9D:
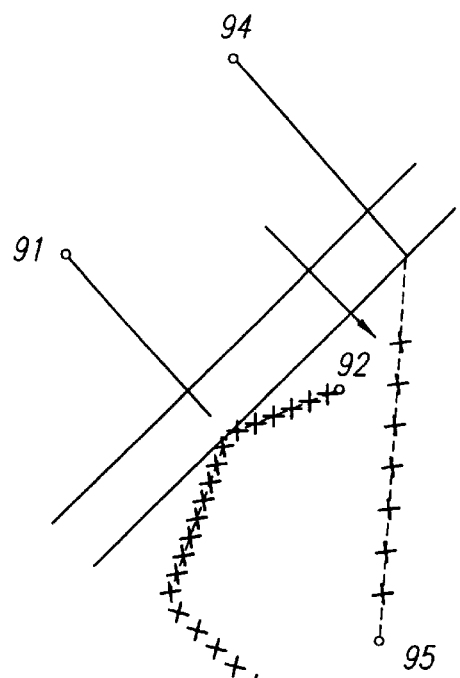
Figure 9E:
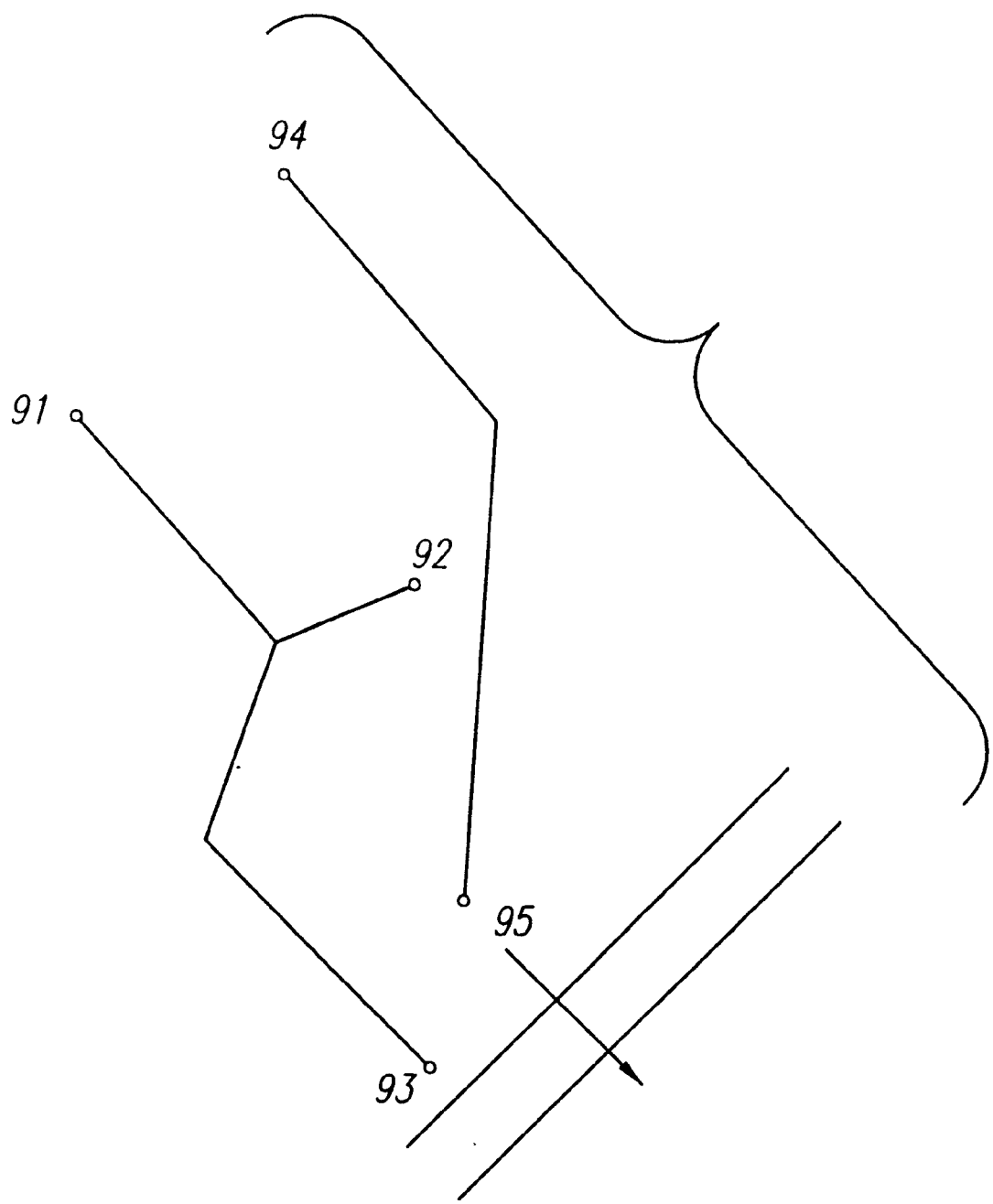

On reaching a grid wherein a decision must be made, as shown in FIG. 9C, the second processor maintains its second path 99 to second target pin 92, and plans the path to third target pin 93. The path is planned, and the system steps through the grids as the wavefront propagates toward the target pins. The resultant planned route is shown in FIG. 9D.

The result is that paths may be planned in accordance with the current invention without reference to a particular geometric orientation.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

We claim:

1. A multithreaded wavefront routing system for creating a plan of a route for wiring for a semiconductor chip surface having a grid arrangement located thereon based on a netlist, comprising:

a sequencing processor for sequentially stepping through the grid arrangement from one chip surface location to another chip surface location in a wavefront, thereby establishing a current grid on the chip surface; and a plurality of processors, wherein each processor comprises:
      a pin identifier for recognizing pins located on the surface of the chip;
      a planner for establishing a proposed route proceeding from a first pin on the chip surface to a subsequent pin on the chip surface; and
      a current grid wire direction planner for individually planning a direction for a wire traversing the current grid.

2. The multithreaded wavefront routing system of claim 1, further comprising a marker for marking connections between routes planned between recognized pins.

3. The multithreaded wavefront routing system of claim 1, further comprising a propagator for propagating from the current grid to a subsequent grid.

4. The multithreaded wavefront routing system of claim 1, further comprising a bookkeeper for performing memory bookkeeping functions.

5. The multithreaded wavefront routing system of claim 1, wherein said planner comprises a semi-hard coded rule based expert system which applies a group of heuristics and plans various routes according to current location of each wire and potential wire locations.

6. The multithreaded wavefront routing system of claim 1, wherein said planner further comprises a reverse direction planner for planning an additional route from one target pin toward the first pin.

7. The multithreaded wavefront routing system of claim 6, wherein the route is planned by a first processor and the additional route is planned by a second processor.

8. The multithreaded wavefront routing system of claim 7, wherein completion of said planned route and said additional planned route result in said first processor and said second processor separately designating meetings, and said meetings are resolved by a meeting resolution processor.

9. The multithreaded wavefront routing system of claim 8, wherein the meeting resolution processor is either the first or second processor.

10. The multithreaded wavefront routing system of claim 1, further comprising a locking mechanism for establishing a lock to avoid concurrent processing by the plurality of processors.

11. The multithreaded wavefront routing system of claim 10, wherein said locking mechanism employs mutex locks.

12. The multithreaded wavefront routing system of claim 1, wherein said planner comprises:
    an evaluator for evaluating current wire position;
    a target pin locator for assessing a target pin location;
    a route appraiser for appraising currently planned routes; and
    a location designator for designating reserved locations wherein the route may be planned subsequent to said current grid.

13. The multithreaded wavefront routing system of claim 12, wherein said location designator reserves a line of grids on the chip surface.

14. The multithreaded wavefront routing system of claim 12, wherein said location designator lifts reservations on any unreserved locations.

15. A method for creating a routing plan for wiring a semiconductor chip surface based on a given netlist, comprising the steps of:
    establishing a first location, a second location, and a grid system on said chip; and
    sequentially traversing from said first location to said second location by sequentially stepping through grids on the surface to establish a current grid using a plurality of processors, comprising the substeps of:
    recognizing pin positions on said surface; and
    simultaneously planning routes from a plurality of first pins through the current grid toward at least one subsequent target pin using said plurality of processors.

16. The method of claim 15, further comprising the substep of propagating to a subsequent grid after said simultaneous route planning substep.

17. The method of claim 16, wherein establishing the grid system comprises establishing a plurality of grids on the chip surface and designating a current grid.

18. The method of claim 16, further comprising the step of establishing a lock to avoid concurrent processing by the plurality of processors.

19. The method of claim 18, wherein said lock establishing step comprises using mutex locks.

20. The method of claim 16, further comprising an additional route planning substep of planning a route from one target pin toward the first pin, wherein said additional route planning substep occurs simultaneously with planning the route from the first pin toward at least one subsequent target pin.

21. The method of claim 20, wherein said route is planned by a first processor and said additional route is planned by a second processor.

22. The method of claim 21, wherein completion of said planned route and said additional planned route result in said first processor and said second processor separately designating meetings, and said meetings are resolved subsequent to designation by said processors.

23. The method of claim 16, wherein said route planning step comprises:
determining a plan for the current grid using each processor according to the substeps of:
evaluating current wire position;
assessing target location;
appraising currently planned routes;
designating reserved locations wherein the route may be planned subsequent to said current grid; and
establishing a wire direction for each wire traversing the current grid.

24. The method of claim 23, wherein said designating substep further comprises removing reservations on any determined unreserved locations.

25. The method of claim 23, wherein said appraising, designating, and establishing substeps utilize a semi-hard coded rule based expert system which applies a group of heuristics and plans various routes according to where each wire is located and potential wire locations.

26. The method of claim 23, wherein said designating substep comprises reserving locations.

27. The method of claim 26, wherein location reservation comprises reserving a line of grids.

28. The method of claim 16, further comprising the step of performing memory bookkeeping functions after said propagating step.

29. A method of simultaneously planning routes for wiring a semiconductor chip surface having a plurality of grids located thereon based on a given netlist from a plurality of first pins through a current grid toward at least one subsequent target pin using a plurality of processors, comprising the steps of:
determining a plan for the current grid using each processor according to the substeps of:
evaluating current wire position;
assessing target location;
appraising currently planned routes;
designating reserved locations wherein the route may be planned subsequent to said current grid; and
establishing a wire direction for each wire traversing the current grid.

30. The method of claim 29, further comprising the substep of planning an additional route from one target pin toward the first pin, wherein said additional route planning occurs simultaneously with planning the route from the first pin toward at least one subsequent target pin.

31. The method of claim 30, wherein said route is planned by a first processor and said additional route is planned by a second processor.

32. The method of claim 31, wherein completion of said planned route and said additional planned route result in said first processor and said second processor separately designating meetings, and said meetings are resolved subsequent to designation by said processors.

33. The method of claim 29, wherein said designating substep comprises reserving locations.

34. The method of claim 33, wherein said designating substep further comprises removing reservations on determined unreserved locations.

35. The method of claim 33, wherein location reservation comprises reserving a line of grids.

36. The method of claim 29, further comprising the step of establishing a lock to avoid concurrent processing by the plurality of processors.

37. The method of claim 36, wherein said lock establishing step comprises using mutex locks.

38. The method of claim 29, wherein said appraising, designating, and establishing substeps utilize a semi-hard coded rule based expert system which applies a group of heuristics and plans various routes according to where each wire is located and potential wire locations.

39. A method of planning multiple routes along a surface of a semiconductor chip surface divided into a plurality of grids using multiple processing threads according to a predetermined netlist, comprising the following steps:
sequentially stepping through the grid arrangement from one chip surface location to another chip surface location in a wavefront, thereby establishing a current grid on the chip surface;
recognizing pins along the wavefront;
using each processing thread to separately plan routes between pins according to the netlist; and
individually planning a direction for each wire traversing the current grid.

40. The method of claim 39, further comprising propagating from the current grid to a subsequent grid after said individual planning step.

41. The method of claim 40, further comprising the step of performing memory bookkeeping functions after said propagating step.

42. The method of claim 40, wherein said using step comprises:
evaluating current wire position;
assessing a target pin location;
appraising currently planned routes; and
designating reserved locations wherein the route may be planned subsequent to said current grid.

43. The method of claim 42, wherein said designating substep comprises reserving locations.

44. The method of claim 43, wherein said designating substep further comprises lifting reservations on any unreserved locations.

45. The method of claim 42, wherein said appraising, designating, and establishing substeps utilize a semi-hard coded rule based expert system which applies a group of heuristics and plans various routes according to where each wire is located and potential wire locations.

46. The method of claim 39, further comprising the step of establishing a lock to avoid concurrent processing by the multiple processing threads.

47. The method of claim 46, wherein locations are locked using mutex locks.

48. The method of claim 39, further comprising the substep of planning an additional route from one target pin toward the first pin, wherein said additional route planning occurs simultaneously with planning the route from the first pin toward at least one subsequent target pin.

49. The method of claim 48, wherein said route is planned by a first processor and said additional route is planned by a second processor.

50. The method of claim 49, wherein location reservation comprises reserving a line of grids.

51. The method of claim 49, wherein completion of said planned route and said additional planned route result in said first processor and said second processor separately designating meetings, and said meetings are resolved subsequent to designation by said processors.

* * * * *